United States Patent
Rodgers et al.

(10) Patent No.: US 9,843,301 B1
(45) Date of Patent: Dec. 12, 2017

(54) SILICON TRANSFORMER BALUN

(71) Applicant: NORTHROP GRUMMAN SYSTEMS CORPORATION, Falls Church, VA (US)

(72) Inventors: Paul L. Rodgers, Solana Beach, CA (US); Dah-Weih Duan, Torrance, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 40 days.

(21) Appl. No.: 15/210,680

(22) Filed: Jul. 14, 2016

(51) Int. Cl.
*H03H 7/42* (2006.01)
*H01P 5/10* (2006.01)
*H01P 3/00* (2006.01)
*H01L 23/66* (2006.01)
*H01P 11/00* (2006.01)
*H01L 21/48* (2006.01)
*H01P 1/18* (2006.01)

(52) U.S. Cl.
CPC ............ *H03H 7/42* (2013.01); *H01L 21/486* (2013.01); *H01L 23/66* (2013.01); *H01P 1/183* (2013.01); *H01P 3/003* (2013.01); *H01P 11/003* (2013.01); *H01L 2223/6622* (2013.01); *H01L 2223/6627* (2013.01); *H01L 2223/6672* (2013.01)

(58) Field of Classification Search
CPC ............ H03H 7/42; H05K 2201/09236; H01L 21/486
USPC ...................................... 333/25, 4
See application file for complete search history.

(56) References Cited

U.S. PATENT DOCUMENTS

| | | | |
|---|---|---|---|
| 4,916,410 A | 4/1990 | Littlefield | |
| 6,072,375 A * | 6/2000 | Adkins | ............... H01P 3/088 333/1 |
| 6,204,736 B1 | 3/2001 | Logothetis | |
| 6,646,518 B2 | 11/2003 | Tajima | |

(Continued)

FOREIGN PATENT DOCUMENTS

GB 2438245 B 5/2010

OTHER PUBLICATIONS

Yeh, Z. -Y. et al. "A Miniature CPW Balun Constructed With Length-Reduced 3 dB Couples and a Short Redundant Transmission Line" Progress in Electromagnetics Research, vol. 117, 2011, pp. 195-208.

(Continued)

*Primary Examiner* — Dean Takaoka
(74) *Attorney, Agent, or Firm* — John A. Miller; Miller IP Group, PLC

(57) ABSTRACT

A transformer balun fabricated in silicon and including a series of alternating metal layers and dielectric layers that define first and second outer conductors that are part of a coaxial structure. Each dielectric layer includes a plurality of conductive vias extending through the dielectric layer to provide electrical contact between opposing metal layers, where a top metal layer forms a top wall of each outer conductor and a bottom metal layer forms a bottom wall of each outer conductor and the other metal layers and the dielectric layers define sidewalls of the outer conductors. Inner conductors extends down both of the first and second outer conductors and a first output line is electrically coupled to a sidewall of the first outer conductor and a second output line is electrically coupled to a sidewall of the second outer conductor.

20 Claims, 3 Drawing Sheets

(56) References Cited

U.S. PATENT DOCUMENTS

| | | | |
|---|---|---|---|
| 7,215,218 B2 | 5/2007 | Burns et al. | |
| 7,302,249 B1 | 11/2007 | Fudem et al. | |
| 7,403,085 B2 * | 7/2008 | Fukunaga | H01P 5/10 333/127 |
| 7,449,975 B2 | 11/2008 | Hoover | |
| 7,535,313 B2 * | 5/2009 | Kim | H01P 5/10 333/185 |
| 7,583,237 B2 | 9/2009 | Noro et al. | |
| 8,427,388 B2 | 4/2013 | Fahs et al. | |
| 8,471,645 B2 | 6/2013 | Ujita et al. | |
| 8,505,193 B2 | 8/2013 | Papananos | |
| 8,803,638 B2 * | 8/2014 | Kildal | H01P 1/2005 333/185 |
| 9,008,603 B2 | 4/2015 | Blanchet et al. | |
| 9,059,494 B2 | 6/2015 | Ding et al. | |
| 2014/0097882 A1 | 4/2014 | Marki | |
| 2014/0225698 A1 | 8/2014 | Swirhun et al. | |

OTHER PUBLICATIONS

Huang, C. -H. et al. "Design of Integrated Planar Marchand Balun Using Physical Transformer Model" IEEE 2009, pp. 1004-1007.

Melais, Sergio E. "Design and Optimization of Broadband Planar Baluns and Dipole Antennas" Graduate Theses and Dissertations University of South Florida, 2005, 122 pgs. http://scholarcommons.usf.edu/2966.

Cloete, J.H. "Exact Design of the Marchand Balun" IEEE Microwave Conference, 9th European, 1979, pp. 480-484.

Phelan, Richard H., "A Wide-Band Parallel-Connected Balun" IEEE Transactions on Microwave Theory and Techniques, vol. MTT-18, No. 5, May 1970, pp. 259-263.

* cited by examiner

US 9,843,301 B1

SILICON TRANSFORMER BALUN

BACKGROUND

Field

This invention relates generally to a transformer balun that can receive an unbalanced input signal and provide two balanced output signals that are 180° out of phase with each other and, more particularly, to a transformer balun that can receive an unbalanced input signal and provide two balanced output signals that are 180° out of phase with each other, where the balun is fabricated using silicon integrated circuit fabrication processes to include alternating metal layers and dielectric layers having conductive vias that define an outer rectangular conductor of a coaxial structure.

Discussion

Transformer baluns are known in the art that receive an unbalanced input signal and provide two balanced output signals that are 180° out of phase with each other. These types of transformer baluns can be of various designs, such as simple quarter-wave length coaxial baluns, perfect double-coaxial baluns, Marchand baluns, magic-T hybrid baluns, Phelan parallel-connected baluns, etc. For example, a Marchand balun is a well known transformer balun that is constructed as a coaxial structure to provide balanced output signals over a multi-octave bandwidth.

Transformer baluns have various applications, for example, as 180° phase shifters for phased antenna arrays. In many of these applications, the electrical circuit or device that includes the transformer balun is fabricated as an integrated circuit using wafer fabrication process, such as in silicon, where the balun is fabricated in combination with other circuit elements. More specifically, integrated circuits are typically fabricated by epitaxial fabrication processes that deposit or grow various device layers on a wafer substrate to provide the circuit components for the device. In these types of fabrication processes, it is necessary that the balun be fabricated in a planar manner, where individual layers of material, such as semiconductor layers, metal layers, dielectric layers, etc., are deposited on top of each other.

For these types of planar fabrication processes, the ability to fabricate coaxial type baluns, such as Marchand baluns, is difficult. Thus, often times these types of integrated circuit baluns are fabricated as interconnected spiral transmission lines. Known transformer baluns employing coupled spiral inductors fabricated using known integrated circuit fabrication methods having very thin intermetal layer dielectrics to achieve a high ratio of even to odd mode impedance can potentially perform over a broad bandwidth. However, control of the known fabrication processes for spiral transmission line balun designs typically have produced baluns of limited bandwidth that may not be suitable for certain applications. For example, in the 45-65 GHz bandwidth that has application for certain phased antenna arrays, the ability to provide a 180° phase shift of an input signal in that entire bandwidth is limited because it is a resonant structure that doesn't have frequency-compensation circuitry, its layout is never perfectly symmetric, or balanced due to layout constraints, and the balun junction where the two balanced conductors are supposed to be floating, i.e, with high RF impedance to ground, are not far enough away from the ground conductors.

BRIEF DESCRIPTION OF THE DRAWINGS

FIG. 2 is a bottom isometric view of the balun shown in FIG. 1;

DETAILED DESCRIPTION OF THE EMBODIMENTS

The following discussion of the embodiments of the invention directed to a coaxial transformer balun fabricated in silicon using integrated circuit fabrication techniques is merely exemplary in nature, and is in no way intended to limit the invention or its applications or uses. For example, as discussed herein, the coaxial balun of the present invention is fabricated by a silicon fabrication process. However, as will be appreciated by those skilled in the art, the balun of the invention can be fabricated using other fabrication processes.

As will be discussed in detail below, the present invention is a true coaxial transformer balun fabricated in a layered structure using silicon integrated circuit fabrication processes that provide ultimate balun performance in bandwidth, balance, return loss, rejection, etc. The balun of the present invention can be configured to provide various balun types, such as simple quarter-wave length coaxials, perfect double-coaxial baluns, Marchand baluns, magic-T hybrid baluns, Phelan parallel-connected baluns, etc. The balun of the invention will be able to be fabricated as part of various circuits, such as mixers, amplifiers, phase shifters, etc.

Figure 1:
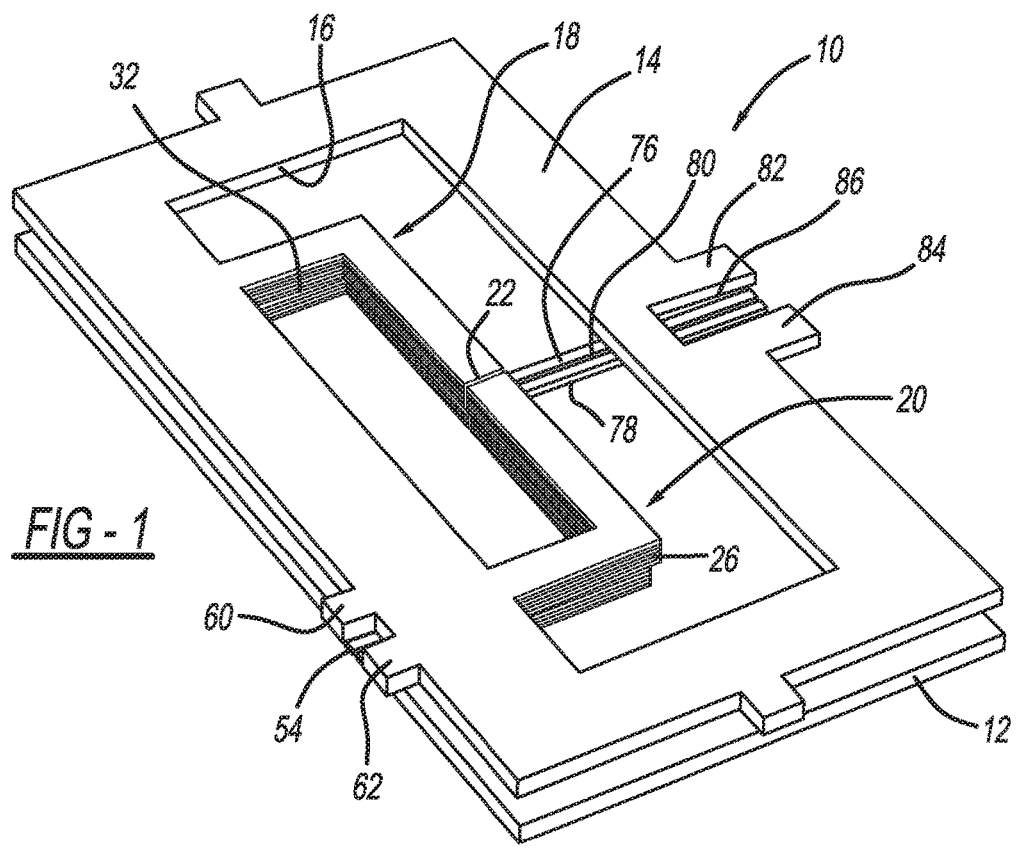
FIG. 1 is a top isometric view of a transformer balun fabricated in silicon and including metal and dielectric layers that define a coaxial configuration to provide a wide bandwidth.

FIG. 1 is a top isometric view of a coaxial transformer balun 10 that has been fabricated on a silicon wafer or substrate 12 with other circuit elements (not shown) using, for example, silicon semiconductor integrated circuit wafer fabrication processes capable of fabricating certain semiconductor devices, such as phase shifters. In this non-limiting example, the silicon wafer fabrication process employs eleven fabrication layers including metal layers and dielectric layers, where each of those fabrication layers will form part of the balun 10 as discussed in detail below. FIG. 2 is an underside isometric view of the balun 10 where the substrate 12 has been removed for clarity purposes. The balun 10 includes an upper conductive frame 14 that is part of a reference plane for all of the circuit elements in the particular device being fabricated, where the frame 14 includes a central opening 16.

The balun 10 also includes a first L-shaped rectangular outer conductor 18 and a second L-shaped rectangular outer conductor 20 that are positioned relative to each other as shown to define a gap 22 therebetween, which forms part of a balun junction further described below. It is noted that the L-shape of the conductors 18 and 20 is specific to this embodiment, where other shapes for the conductors 18 and 20 may be applicable in other embodiments, such as straight conductors, meandering conductors, etc. As will become apparent from the discussion below, the rectangular conductors 18 and 20 form an outer conductor of a first coax having a center conductor, and an inner conductor of a second coax, where the outer conductor for the second coax is the frame 14. It is essential to recognize that the two coax structures and the dual roles of the conductors 18 and 20 in these coax structures play a key role in determining the bandwidth performance of the balun 10.

The conductors 18 and 20 are defined by a silicon fabrication process through a number of layers 26, here eleven, where a bottom metal layer 28 forms a bottom wall of the conductors 18 and 20 and a top metal layer 30 forms a top wall of the conductors 18 and 20, and where the top layer 30 is part of the frame 14 and the bottom layer 28 is deposited on the substrate 12. It is noted that the bottom layer 28 does not necessarily need to be deposited on the substrate 12, i.e., it is not necessary to choose the bottom metal layer of the processing technology as the bottom layer 28. The bottom layer 28 and the top layer 30 are chosen from the available metal layers so that the first coax and the second coax have the right impedances for wideband performance. Each of the other layers 26 between the bottom layer 28 and the top layer 30 include an alternating pattern of a metal layer and a dielectric layer, where the dielectric layers include a number of conductive vias (see FIG. 3) extending therethrough to make electrical contact with the adjacent metal layers.

Each of the metal layers and dielectric layers 26 between the top layer 30 and the bottom layer 28 are etched and patterned so that they form opposing sidewalls 32 of the conductors 18 and 20 so that the conductors 18 and 20 are internally open and define an outer conductor for the first coax. Note that it is essential to keep the outer shape and the dimensions of the conductors 18 and 20 identical to each other so that they are totally balanced. On the other hand, the inner opening of the conductors 18 and 20 may be of different dimensions, where the dimensions are selected to produce the desired impedances for each segment of the first coax. The different inner opening dimensions can be easily achieved by raising the floor or bringing down the ceiling using the same metal-via stack-up technique. It is just as essential to keep the cross-section dimensions of the conductors 18 and 20 as small as possible. The smaller the cross-section, the higher the impedance of the second coax and the wider the bandwidth the balun 10 will have.

Figure 3:
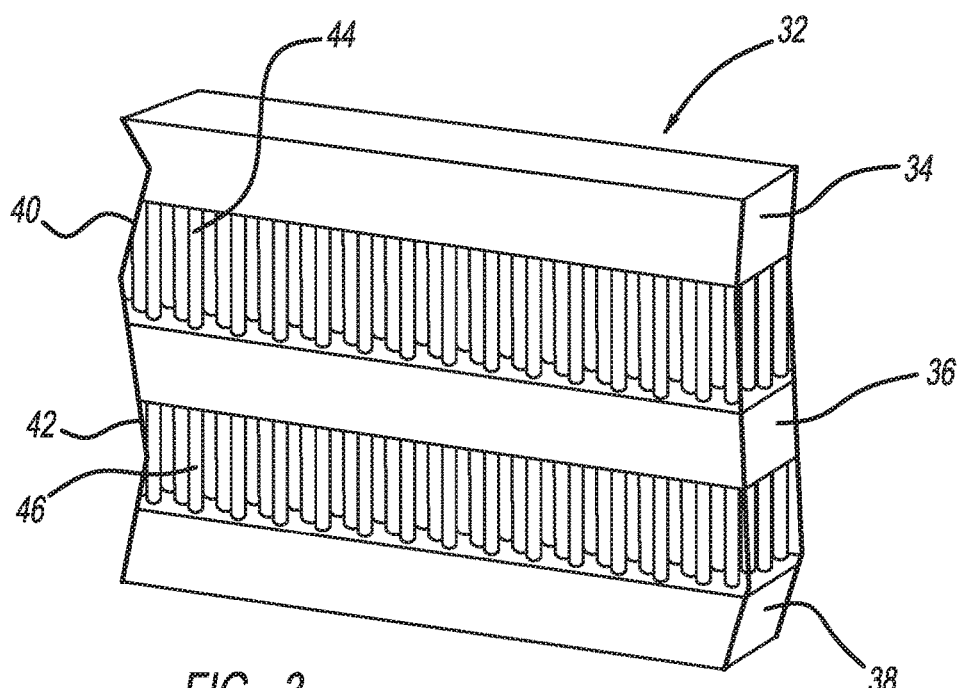
FIG. 3 is a broken-away section of the balun showing alternating metal layers and dielectric layers.

FIG. 3 is an illustration of a section of one of the sidewalls 32 of the outer conductor 18 showing a few of the layers 26 to illustrate the conductive vias. Specifically, the illustration of FIG. 3 shows metal layers 34, 36 and 38, where the layers 34 and 36 are separated by a dielectric layer 40 and the metal layers 36 and 38 are separated by a dielectric layer 42. A plurality of conductive vias 44 are provided through the dielectric layer 40 during the fabrication process so that the metal layers 34 and 36 are electrically coupled and a plurality of conductive vias 46 are fabricated through the dielectric layer 42 so that the layers 36 and 38 are electrically coupled. The vias 44 and 46 are not shown in FIGS. 1, 2 and 4 merely for clarity purposes. The fabrication steps necessary to provide the vias 44 and 46 through the dielectric layers 40 and 42, respectively, are well known to those skilled in the art.

A coplanar waveguide (CPW) input feed structure 50 is provided proximate an open end 52 of the conductor 20, and is fabricated as part of one of the metal layers. The CPW feed structure 50 includes a center conductor 54 positioned adjacent to and electrically separated from ground conductors 56 and 58 that are positioned below tabs 60 and 62 extending from the frame 14. The center conductor 54 is electrically coupled to a conductive via 64 provided through one of the dielectric layers that is electrically coupled to an inner conductor 70 fabricated as part of the metal layer just below that dielectric layer, where the inner conductor 70 extends through the open end 52 and into the outer conductor 20. The inner conductor 70 is electrically coupled to an inner conductor 74 at the gap 22 (see FIG. 4) that extends through the conductor 18, where it ends before it reaches an end wall 72 of the conductor 18. In this non-limiting embodiment, the inner conductor 70 is narrower than the inner conductor 74. It is noted that the CPW feed structure 50 is not an essential part of the balun 10, where the balun 10 could employ any suitable transmission line structure, such as a coax, a semi-coax line, an inverted microstrip line, etc. The key is to use the right impedance (typically 50 ohm) that the balun 10 is designed for, and to match the line type used in the feeding circuitry.

Figure 4:
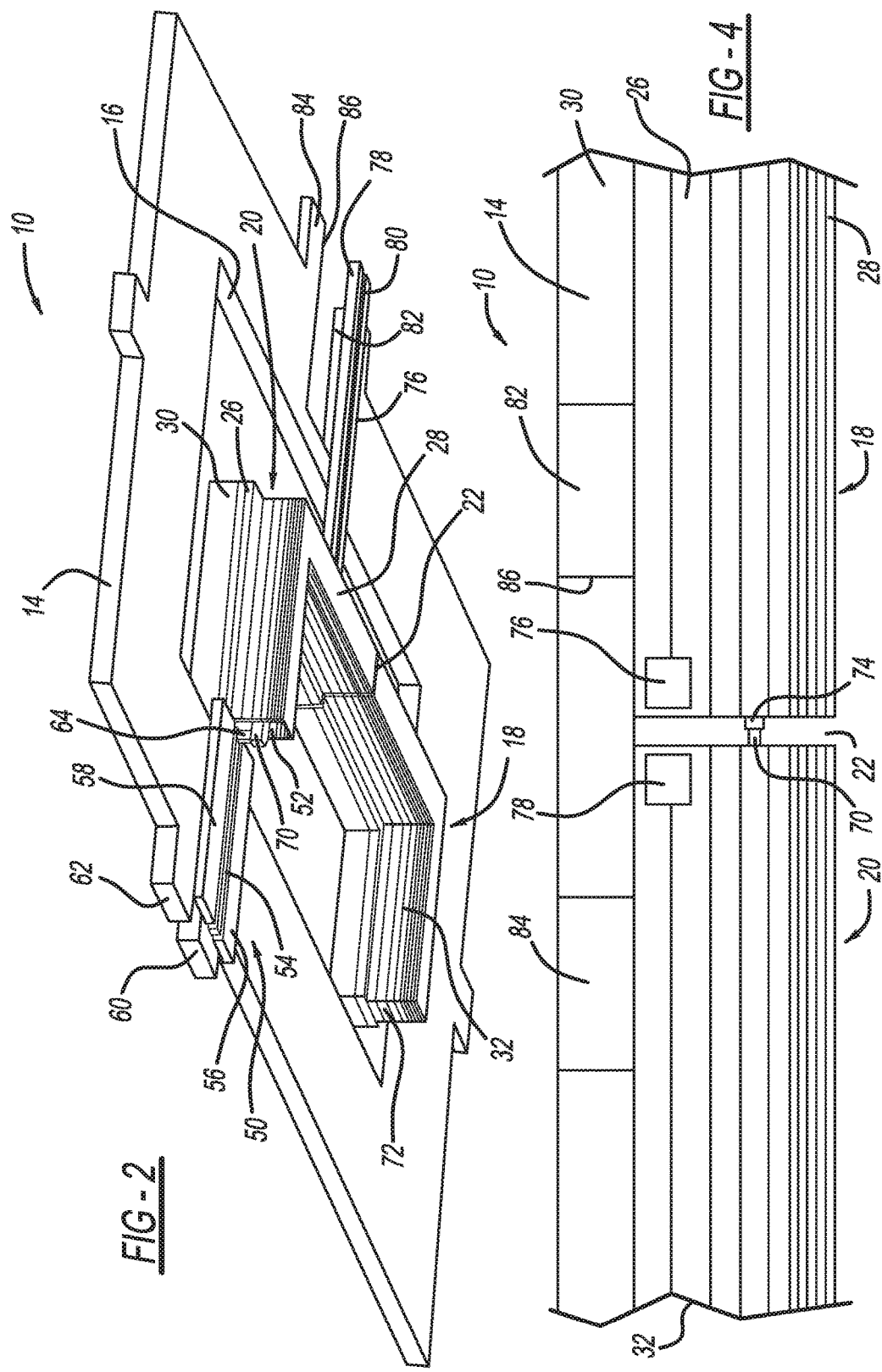
FIG. 4 is a cut-away, back view of the balun shown in FIG. 1.

As discussed above, the balun 10 includes two balanced outputs, specifically a 0° output and a 180° output. FIG. 4 is a cut-away profile view of a portion of the balun 10 showing output lines 76 and 78 separated by an air gap 80 that provide these outputs. The output line 76 is electrically coupled to the side wall 32 of the conductor 18 and the output line 78 is electrically coupled to the side wall 32 of the conductor 20, where the output lines 76 and 78 extend below and between tabs 82 and 84 defining a slot 86 in the frame 14, as shown, and where the slot 86 creates a transmission line having a proper impedance. The depiction of the location of the output lines 76 and 78 in this embodiment is merely representative of one example in that the output lines 76 and 78 can be electrically coupled to the outer conductors 18 and 20, respectively, at any suitable location. The balun junction referred to above includes the gap 22 and the inner conductor 70, where the output lines 76 and 78 must coupled to the conductors 18 and 20 proximate the balun junction. The impedance and electrical length and hence the shape and spacing of the balanced lines 76 and 78 are critical to the design.

An unbalanced signal applied to the inner conductor 70 in, for example, the 45-65 GHz frequency band, propagates down the conductors 70 and 74 and is electrically coupled into the conductors 18 and 20 in a manner well understood by those skilled in the art, where the conductors 18 and 20 reduce the amount of electromagnetic radiation that will leak out, and also shield the inner conductors 70 and 74 from the frame 14. The resulting balanced output signals provided on the output lines 76 and 78 are 180° out of phase with each other, and can provide a return loss of ≤15 dB across the entire band. It is noted that as discussed herein, the unbalanced input signal is provided to the inner conductors 70 and 74 and the balanced output signals are provided on the output lines 76 and 78. However, the balun 10 can be used in the reverse signal flow direction where a balanced input signal is provided to the lines 76 and 78, and an unbalanced output signal is output at the CPW feed structure 50.

The balun 10 includes the L-shaped conductors 18 and 20, where the shape of the conductors 18 and 20 provides for a more compact configuration, but may not provide an optimum performance. In an alternate embodiment, straight conductors may be more ideal.

Figure 5:
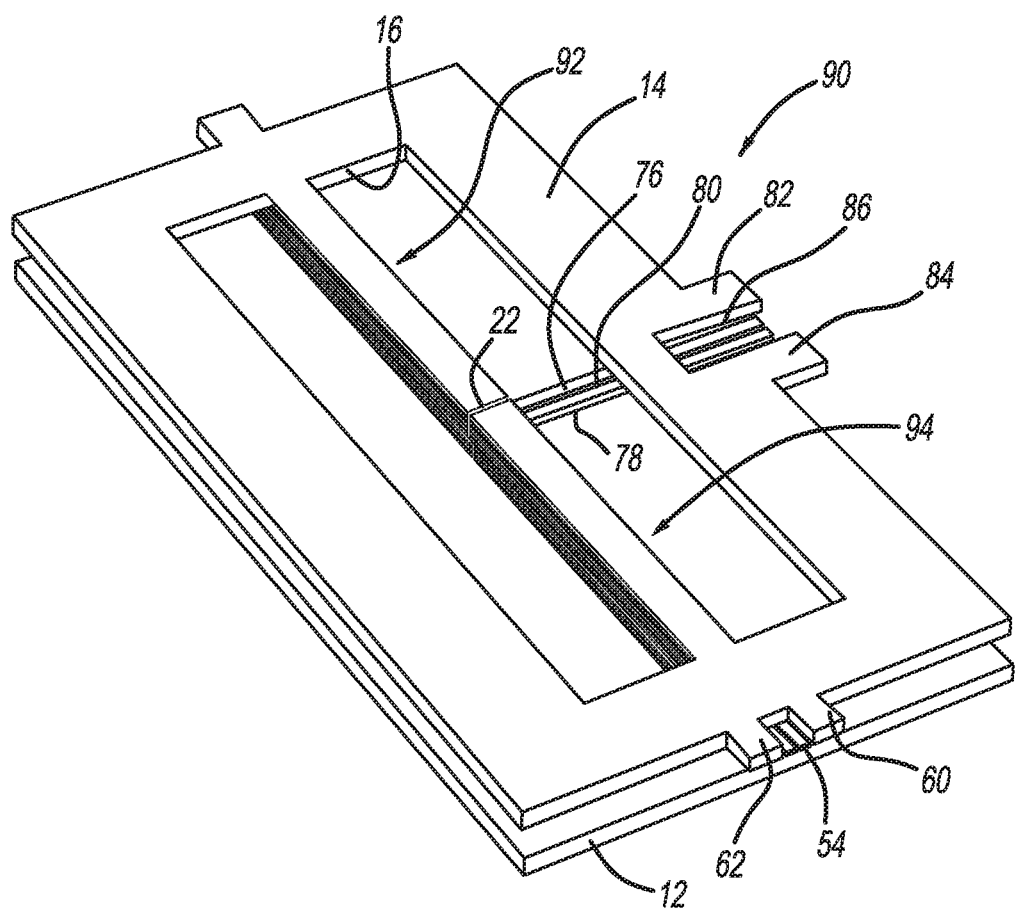
FIG. 5 is a top isometric view of a transformer balun of the type shown in FIG. 1, but having straight conductors.

FIG. 5 is a top isometric view of a coaxial transformer balun 90 that is similar to the balun 10 to show this embodiment, where like elements are identified by the same reference number. In the balun 90 the L-shaped conductors 18 and 20 have been replaced with straight conductors 92 and 94 that operate in the same manner.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A transformer balun comprising:
   a substrate;
   a series of alternating metal layers and dielectric layers provided on the substrate and being configured to define a first outer conductor and a second outer conductor that are part of a coaxial structure and that are spaced apart from each other to define a gap therebetween, wherein each dielectric layer includes a plurality of conductive vias extending through the dielectric layer to provide electrical contact between opposing metal layers, and wherein a top metal layer forms a top wall of the outer conductors and a bottom metal layer forms a bottom wall of the outer conductors and the other metal layers and dielectric layers define sidewalls of the outer conductors;
   a first inner conductor extending down the first outer conductor and a second inner conductor extending down the second outer conductor where the first and second inner conductors are electrically coupled in the gap, wherein the first and second inner conductors and the gap define a balun junction; and
   first and second output lines where the first output line is electrically coupled to a sidewall of the first outer conductor and the second output line is electrically coupled to a sidewall of the second outer conductor proximate the balun junction.

2. The balun according to claim 1 further comprising a coplanar waveguide (CPW) feed structure formed as part of one of the metal layers, said CPW feed structure including a center conductor electrically separated from opposing reference conductors, where the center conductor is electrically coupled to the first inner conductor through a conductive via extending through one of the dielectric layers.

3. The balun according to claim 1 wherein the first inner conductor has a narrower width than the second inner conductor.

4. The balun according to claim 1 wherein the first and second outer conductors are rectangular-shaped conductors.

5. The balun according to claim 1 wherein the first and second outer conductors are straight conductors.

6. The balun according to claim 1 wherein the first and second outer conductors are L-shaped conductors.

7. The balun according to claim 1 wherein the balun is fabricated by a silicon semiconductor fabrication process.

8. The balun according to claim 7 wherein a number of the metal layers and the dielectric layers is eleven metal layers and dielectric layers.

9. The balun according to claim 1 wherein the balun is part of a phased array.

10. The balun according to claim 9 wherein the balun operates across a 45-65 GHz frequency band.

11. A transformer balun fabricated by an integrated circuit silicon fabrication process, said balun comprising:
    a substrate;
    a series of alternating metal layers and dielectric layers provided on the substrate and being configured to define a first rectangular outer conductor and a second rectangular outer conductor that are part of a coaxial structure and that are spaced apart from each other to define a gap therebetween, wherein each dielectric layer includes a plurality of conductive vias extending through the dielectric layer to make electrical contact between opposing metal layers, and wherein a top metal layer forms a top wall of the outer conductors and a bottom metal layer forms a bottom wall of the outer conductors and the other metal layers and dielectric layers define sidewalls of the outer conductors;
    a first inner conductor extending down the first outer conductor and a second inner conductor extending down the second outer conductor where the first and second inner conductors are electrically coupled in the gap, wherein the first and second inner conductors and the gap define a balun junction;
    a coplanar waveguide (CPW) feed structure formed as part of one of the metal layers, said CPW feed structure including a center conductor electrically separated from opposing reference conductors, where the center conductor is electrically coupled to the first inner conductor through a conductive via extending through one of the dielectric layers; and
    first and second output lines where the first output line is electrically coupled to the sidewall of the first outer conductor and the second output line is electrically coupled to the sidewall of the second outer conductor proximate the balun junction.

12. The balun according to claim 11 wherein the first inner conductor has a narrower width than the second inner conductor.

13. The balun according to claim 11 wherein the first and second outer conductors are straight conductors.

14. The balun according to claim 11 wherein the first and second outer conductors are L-shaped conductors.

15. The balun according to claim 11 wherein a number of the metal layers and the dielectric layers is eleven metal layers and dielectric layers.

16. The balun according to claim 11 wherein the balun is part of a phased array.

17. A method for fabricating a transformer balun comprising:
    providing a substrate;
    depositing a series of alternating metal layers and dielectric layers on the substrate in a configuration to define a first outer conductor and a second outer conductor that are part of a coaxial structure and that are spaced apart from each other to define a gap therebetween, wherein each dielectric layer includes a plurality of conductive vias extending through the dielectric layer to provide electrical contact between opposing metal layers, and wherein a top metal layer forms a top wall of each outer conductor and a bottom metal layer forms a bottom wall of each outer conductor and the other metal layers and dielectric layers define sidewalls of the outer conductor;
    configuring a first inner conductor extending down the first outer conductor and a second inner conductor extending down the second outer conductor where the first and second inner conductors are electrically coupled in the gap, wherein the first and second inner conductors and the gap define a balun junction; and
    configuring first and second output lines so that the first output line is electrically coupled to a sidewall of the first conductor and the second output line is electrically coupled to a sidewall of the second conductor proximate the balun junction.

18. The method according to claim 17 further comprising configuring a coplanar waveguide (CPW) feed structure as part of one of the metal layers so that the CPW feed structure including a center conductor electrically separated from opposing reference conductors, where the center conductor is electrically coupled to the inner conductor through a conductive via extending through one of the dielectric layers.

19. The method according to claim 17 wherein the first and second outer conductors are rectangular-shaped conductors.

20. The method according to claim 17 wherein the balun is fabricated by a silicon semiconductor fabrication process.

* * * * *